(12) United States Patent
Nakamura et al.

(10) Patent No.: US 7,255,597 B2
(45) Date of Patent: Aug. 14, 2007

(54) DETACHABLE ATTACHMENT STRUCTURE AND ELECTRIC CONNECTION BOX THEREWITH

(75) Inventors: Yoshio Nakamura, Shizuoka (JP); Hiroaki Arai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 444 days.

(21) Appl. No.: 10/711,011

(22) Filed: Aug. 17, 2004

(65) Prior Publication Data

US 2005/0056447 A1    Mar. 17, 2005

(30) Foreign Application Priority Data

Sep. 11, 2003    (JP)    ............................. 2003-319865

(51) Int. Cl.
*H02B 1/01*    (2006.01)
(52) U.S. Cl. ........................................ 439/573; 439/535
(58) Field of Classification Search .................. 439/34, 439/76.2, 535, 564, 573
See application file for complete search history.

(56) References Cited

U.S. PATENT DOCUMENTS 6,736,659 B1 * 5/2004 Wu ............................ 439/247
6,739,880 B2 * 5/2004 Toyota ......................... 439/74
6,824,399 B2 * 11/2004 Smith et al. ................... 439/82

FOREIGN PATENT DOCUMENTS

| DE | 3314910 A1 * | 10/1984 |
|---|---|---|
| JP | 2000-4526 | 1/2000 |
| JP | 2000-78721 | 3/2000 |
| JP | 2000-350331 | 12/2000 |
| JP | 2003-189440 | 7/2003 |

* cited by examiner

*Primary Examiner*—Khiem Nguyen
(74) *Attorney, Agent, or Firm*—Kratz, Quintos & Hanson, LLP

(57) ABSTRACT

The case main body is saliently provided with an attachment bracket 65 having a screw hole 69a and the attachment bracket 65 is provided with a slit 69b communicated with the screw hole 69a and extending to the radial direction outwardly. When the wiring harness guided out from the case main body is pulled or twisted at the time of recovery of the case main body, the axial portion of a securing bolt expands the slit 69b and escapes from the slit 69b so that the attachment bracket 65 detaches from the securing bolt. A taper portion 69d is formed at the entrance side of slit 69b for guiding the penetration of the securing bolt. The slit 69b is positioned before an edge portion 69c of the attachment bracket 65.

7 Claims, 5 Drawing Sheets

DETACHABLE ATTACHMENT STRUCTURE AND ELECTRIC CONNECTION BOX THEREWITH

BACKGROUND OF THE INVENTION

1. Field of the Invention

The present invention relates to detachable attachment structure and electric connection box therewith which is attached to panel or reinforcement of a vehicle, and is effective in recovery of the electric connection box connected to wiring harness, a harness protector, etc.

2. Related Art

A plurality of long members such as wiring harness are arranged in a vehicle. These wiring harness are connected with a junction box as an electric connection box, a connector block, a relay block, an ECU box, etc. attached in the vehicle body panel etc., or protected by a harness protector. For example, as shown in FIG. 6, a junction box 10 attached with a securing bolt (not shown) to one panel side 20a of the vehicle body panel 20 and the junction box 10 attached in another panel side 20b are connected through a wiring harness 25, and this wiring harness 25 is arranged along a reinforcement 21.

At the time of vehicles scrap, a J hook 26 is hooked on the central part of the wiring harness 25 arranged, the J hook 26 is pulled by the crane etc. above the vehicle body panel 20, and the recovery of the junction block 10 is performed.

However, since the junction box 10 is firmly fixed so that it may not fall away by vibration during moving vehicle, when the J hook 26 is pulled, the wiring harness 25 disconnects, or the connector connected to the junction box 10 pulls out, and only the junction box 10 might be left at the vehicle body panel 20.

And when the junction box 10 is left, the securing bolt inserted from attachment brackets 15 and 17 of the junction box 10 is loosened by an impact wrench etc., and the junction box 10 is removed while the worker body is bent. Then the man-hour increases to detach and it causes a problem that the recovering workability becomes worse.

Then, in order to solve this problem, an attachment construction where electric connection boxes such as a junction box fixed to a vehicle body panel etc., are easily recovered is proposed by the applicant (patent reference 1).

The junction box is provided with the case body 54 receiving a fuse, a relay, etc. inside, and an attachment bracket 50 (FIG. 7) disposed to the case main body 54 and fixed to a vehicle body panel. The attachment bracket 50 has a tongue shape, projected and formed at the side of the case main body 54, and is fixed to a vehicle body panel with a securing bolt.

The easy fracture portion 53 formed in the attachment bracket 50 is formed with a cutout 51 and a fracture hole 52 aligned the same line with the cutout 51. The smaller cross section of the easy fracture portion 53 than other portions causes the stress concentration at this portion, and is capable of fracture separation of the case main body 54 and the attachment bracket 50 by small external force.

According to this construction, if an external force acts on the junction box, a crack generates at easy fracture portion 53 of the attachment bracket 50 and progresses along the L line connecting the cutout 51 and a fracture hole 52. It is effective to recover the case main body 54 without damaging the case main body 54.

The following patent documents disclose other conventional examples (patent documents 2-4). The patent document 2 discloses that the case main body is provided with a retractable movable bracket and a urging member to urge the movable bracket, and the movable bracket is disposed at the attachment part of the vehicle body in a stretched state. On recovering the case main body, the wiring harness from the case main body is pulled, the movable bracket is shrunk, and the case main body is detached from the attachment part of the vehicle side.

The patent document 3 discloses that a case main body is provided with an attachment portion having an assembly hole, an auxiliary member having a male screw is screwed together a female screw of the assembly hole and the case main body is attached to the vehicle body. On recovering the case main body, the wiring harness guided out from the case main body is pulled out, the thread of the male screw is deformed, the auxiliary member is detached from the assembly hole, and the case main body is detached from the vehicle body.

Patent document 4 discloses that an attachment portion protruded from the case main body fixed to the vehicle body comprises a flat portion, a screw hole disposed in the center of width direction of the flat portion, and a tube provided perpendicularly along the edge of the screw hole. By adjusting the thickness of the flat portion, the flat portion does not fracture using the vehicle, but fractures on recovering the case main body.

Patent document 1: JP.2000-350331(pages 2-3, FIG. 3)
Patent document 2: JP.2000-4526(pages 2-3)
Patent document 3: JP.2000-78721(pages 2-3)
Patent document 4: JP.2003-189440(pages 2-3)

However, there is a following problem to be solved with the aforementioned conventional attachment structure.

In the 1st conventional example (patent document 1), when contingency external force acts on the easy fracture part 53 by the vibration or shock under vehicles run, there is a possibility that the easy fracture part 53 might fracture carelessly. When the easy fracture part 53 fractures, a junction box may separate from a vehicle body panel and hang in air, then a connector may fall out from a junction box causing a non-conducting state, the wiring harness may be disconnected, or the junction box itself may be collided and damaged on the vehicle body panel. Moreover, since the attachment bracket 50 is fractured, even if the case main body 54 is recovered, it is not reusable.

In the 2nd conventional example (patent document 2), the case main body is not attached with the securing bolt, but secured to a vehicle body side only by a spring force of an urging member. When a movable bracket or the attachment portion of the body side receives contigency external force by the vibration or shock during vehicles run, there is a fear of the case main body detaching from the body side like the 1st conventional example.

In the 3rd conventional example (patent document 3), a case main body can be non-destructively recovered without damaging an attachment portion, but another member, i.e. an auxiliary member, besides the case main body is required and increases the number of parts resulting in the additional time for installing the case main body. Moreover, a female screw is formed at a assembly hole of the attachment portion, and a male screw is formed in an auxiliary member. Then the processing cost becomes higher and the cheap price auto parts can not be provided.

Although the 4th conventional example (patent document 4) offers a attachment structure of simple constitution, it is difficult to set a board thickness of a flat portion as an arbitrary board thickness so that the flat portion may not be fractured at the time of vehicles use but may be fractured at the time of the case main body recovery. In case there is a fear of the flat portion fracturing at the time of vehicles use, or the flat portion not fracturing at the time of the case main body recovery.

In view of the aforementioned points, the present invention aims to provide a detachable attachment structure and an electric junction box thereof which prevent the part main body from falling away improperly from a vehicle body by the vibration or shock of a moving vehicle and are capable of removing the part main body from the vehicle body only at the disassembly of the vehicle resulting in the improvement of the recovery workability and recycling of the part main body.

SUMMARY OF THE INVENTION

It is the objective of the present invention to solve the above subject by providing a detachable attachment structure. The part main body is attached to a vehicle body by a securing means and provided with a vehicle attachment portion having a screw hole.

The vehicle body attachment portion is provided with a slit communicated to the screw hole and extending outwardly to the radial direction. At the time of recovery of the part main body, the part main body is pulled or twisted in the direction separating from the vehicle body side, the aforementioned securing portion extends and passes the slit, and the vehicle attachment portion is separated from the securing member.

Thereby, the part main body is strongly fixed to the vehicle body side by the securing member through the vehicle body attachment portion. Even if unexpected external force, such as vibration or shock under vehicles run, acts on the part main body, the part main body is prevented for separating from the vehicle body side. Meanwhile, when the part main body is pulled or twisted in the direction separating from the vehicle body side at the time of recovery of the part main body, the vehicle body attachment portion secured in the direction of its thickness between the vehicle body side and the securing member shifts in the right angle to the axis of the securing member resisting to the securing force. Then the axial portion of the securing member extends the slit and escapes from one side to the other side of the slit, the vehicle body attachment portion is separated from the securing member, and the part main body is recovered from the vehicle body. The securing member means bolt, screw, etc. which have a screw thread.

Preferably, the slit reaches before the edge of the vehicle body attachment portion.

Thereby, the tip of the slit is a closed end and it is prevented that the tip side of the vehicle body attachment portion is divided by the slit.

Preferably, a thin portion which fractures and separates preferentially at the time of recovery of the part main body is formed in the tip side of the slit.

Thereby, when the part main body is pulled or twisted, the axial part of the securing member enters into the slit, the thin portion is pulled in the circumferential direction by the tensile stress of the direction of the circumference, the thin portion is fractured and separated by a small force, and other parts of the vehicle attachment portion are not broken at separation.

Preferably, the slit is formed in the projection direction of the vehicle body attachment portion.

Thereby, the tensile force acts on the root side of the vehicle attachment portion and the vehicle body attachment portion becomes to be broken hard compared to the case of the shearing force and the slit is easily opened.

Preferably, the taper part guiding the penetration of the securing bolt to the entrance side of the slit is formed.

Thereby, the axial portion of the securing member abuts the taper and is guided thereby and becomes easy to enter the slit.

The vehicle body attachment portion is made of an elastic synthetic resin material.

Thereby, the vehicle body attachment portion becomes easy to be bend and the slit becomes easy to be opened in the direction of the circumference at the time of recovery of the part main body. For example, as an elastic synthetic resin material, polypropylene, polyethylene, a polyethylene compound, nylon 6, nylon 66, etc. are applied.

Preferably, the electric connection box is characterized in that electric parts connecting wiring harness are received in the part main body and the wiring harness is pulled or twisted in the direction separating from the vehicle body side at the time of recovery of the part main body and the part main body is collected from the vehicle.

Thereby, when the wiring harness is pulled or twisted to the extent that the connector as electric parts etc. is not pulled out and separated or wiring harness is not disconnected, the part main body moves to separate from the vehicle body, the axial portion of the securing member extends the slit and escapes from one side to the other side of the slit, the vehicle body attachment portion is separated from the securing member, and the part main body is collected from the vehicle body side.

BRIEF DESCRIPTION OF THE DRAWINGS

FIG. 3A shows a plan view of the fixed state of the attachment bracket, FIG. 3B a plan view of the state of the axial part of the securing bolt advanced into the slit, and FIG. 3C a plan view of the state of the attachment bracket just before separating from the securing bolt;

DETAILED DESCRIPTION OF THE PREFERRED EMBODIMENTS

Figure 1:
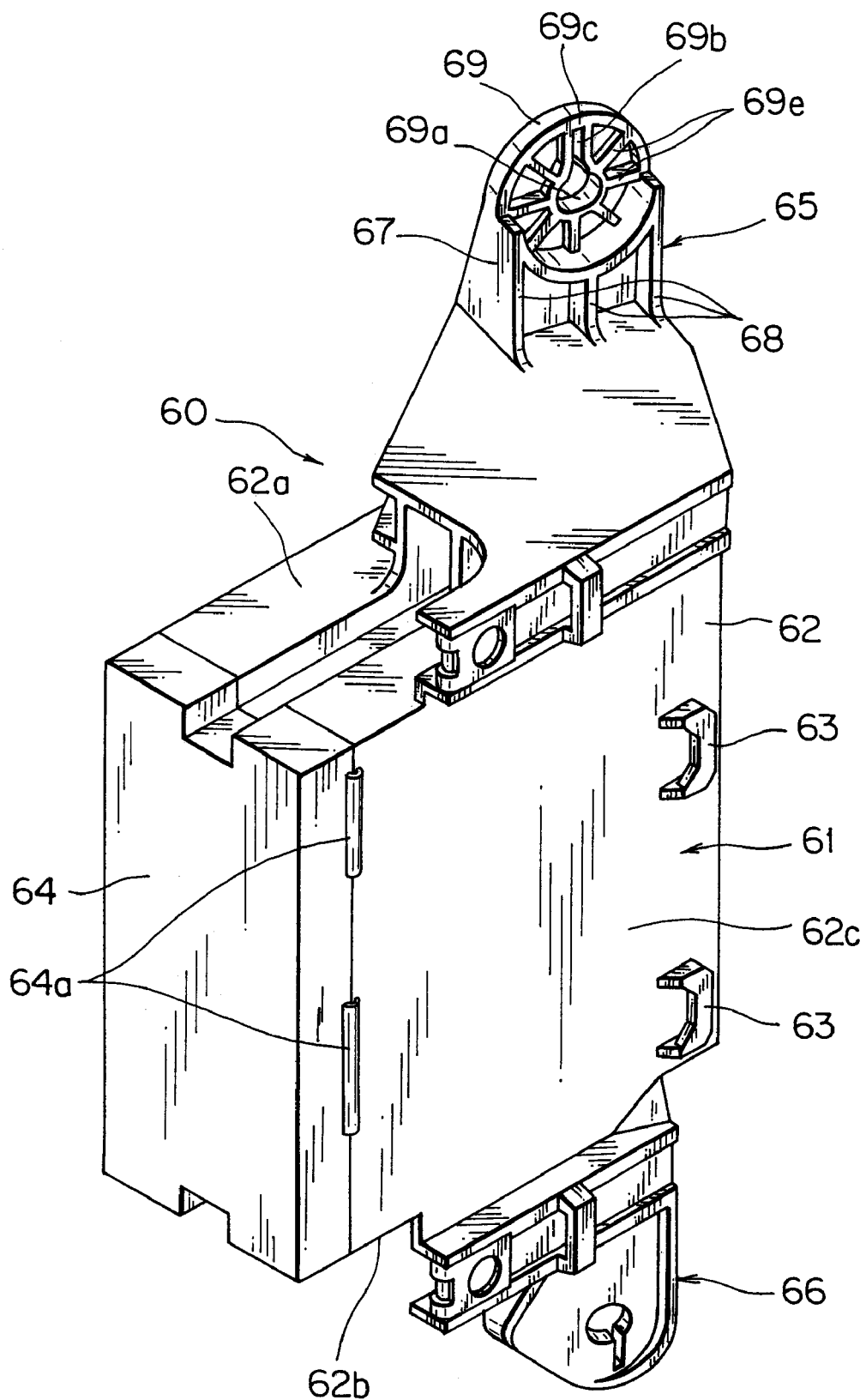
FIG. 1 is a perspective view showing the 1st embodiment of the electric connection box provided with the detachable attachment structure according to the present invention.
Figure 2:
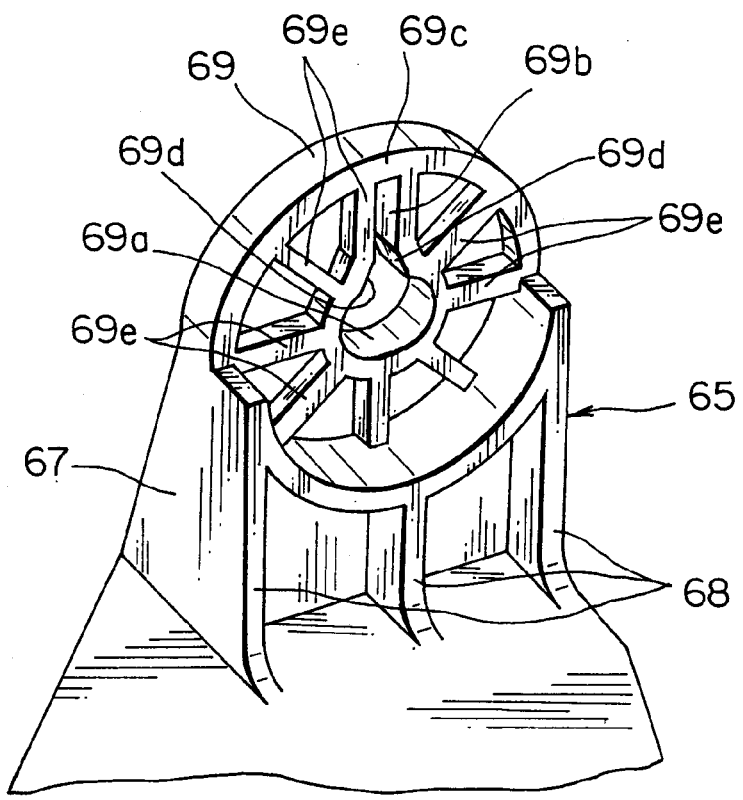
FIG. 2 is an enlarged view of the attachment bracket of the electric connection box shown in FIG. 1.

Embodiments of the present invention are described below with reference to the attached drawings. FIGS. 1 to 3 show the first embodiment of an electric connection box equipped with the detachable attachment structure of this invention and FIGS. 4 and 5 similarly show the 2nd embodiment of an electric connection box.

The junction box 60 as an electric connection box is shown by the 1st embodiment and the connector block 80 as an electric connection box is shown by the 2nd embodiment.

The junction box 60 is an auto part housing the electric part block (electric parts) having relay, fuse, etc., and the branch circuit block (electric parts) having bus bar or conductive wire, or etc. A connector block 80 is an auto part which concentrates and receives the connector (electric parts) connected to the branch line of the wiring harness 90. The junction box 60 and the connector block 80 are attached in the cowl side panel (body side) or an reinforcement (body side) 95, not shown, around the instrument panel disposed densely by electric equipment such as instruments etc.

Detachable attachment structure of the present invention is applied to not only the electric connection box of the junction box 60 but the fuse block intensively equipped with fuses or the relay block equipped with relays. It is also applied to the harness protector which protects a wiring harness 90 from external interference.

The electric connection boxes 60 and 80 equipped with the detachable attachment structure of the present invention can prevent from separating improperly of the case main body (part main body) 61 or the block main body (part main body) 81 from the cowl side panel or the reinforcement 95 by the vibration or the shock under vehicles run. The case main body 61 or the block main body 81 can be removed from the cowl panel side or the reinforcement 95 only at the time of vehicles dismantlment and the recovery workability and recyclability of the case main body 61 or the block main body 81 can be improved. In the electric connection boxes 60 and 80 equipped with the detachable attachment structure for attaching to the case main body 61 with a securing bolt (a securing means) 70 capable of recovery, attachment brackets (vehicle body attachment portion) 65, 66, 85, and 86 having screw holes 69a and 88a are provided the case main body 61 in an extended manner, a slit 69b or 88b is provided outside in the radius direction communicating with a screw hole 69a or 88a in the attachment brackets 65, 66, 85, and 86. When the wiring harness 90 guided from the case main body 61 etc. is pulled or twisted at the time of recovery of the case main body 61 etc., it is firstly characterized that an axial part 70b of the fixing bolt 70 extends a slit 69b and 88b and the attachment brackets 65, 66, 85, and 86 separate from the fixing bolt 70. It is effective that a taper portion 69d is formed to guide the entrance of the fixing bolt 70 to the entrance side of the slits 69b and 88b.

It is secondly characterized that the tip of slits 69b and 88b reach before the edge 69c and 88c of the attachment brackets 65, 66, 85, and 86. It is effective that a thin portion 88d, which separates preferentially at the time of recovery of the block main body 81, is formed at the tip part of slits 69b and 88b.

The main constitution portion and its action of the junction box 60 of the 1st embodiment are explained below.

As shown in FIG. 1, the junction box 60 comprises the case main body 61 and the electric part blocks (not shown) to which wiring harness is connected. The electric part block is fixed by a fixing means inside the case main body 61 and water-proofed and protected from the exterior interference.

The case main body 61 of a rectangular shape box is mold forming of synthetic resin material, such as polypropylene, comprising a an exterior wall including a circumferential wall 62, a front cover 64 which opens and closes a front opening freely, and a back cover (not shown) which closes the opening on the backside. The front cover 64 is connected with the circumferential wall 62 in one through a pair of hinges 64a and 64a. Although a back cover is formed separately, it is joined to the circumferential wall 62 by engaging the locking piece to a locking frame 63 provided saliently by the wall 62c and 62c on either side.

The circumferential wall 62 comprises the wall 62a and 62b of the upper and lower sides opposing to each other and wall 62c of either side. One piece of tongue-like attachment brackets 65 and 66 is formed saliently at the upper and lower wall 62a and 62b, respectively. Since the attachment brackets 65 and 66 is made of flexible synthetic resin material, such as polypropylene and polyethylene, even if pulled at the time of case main body 61 recovery, and breaking from root is prevented.

Each attachment brackets 65 and 66 comprises a base 67 continuing to the wall 62 and a seat 69 of generally semi-circle form following the base 67. The base 67 is provided with a plurality of reinforcement ribs 68 to protect the slant. The seat 69 is a portion which is hold between the cowl side panel and a head 70a of a securing bolt 70 and fixed.

As shown in FIG. 2, the screw hole 69a for inserting the securing bolt to the axis direction is formed through at the nearly center of the seat 69. A radial rib 69a for reinforcement is disposed in circumferential direction at the same pitch around the screw hole 69a. The slit 69b is formed jointly to the screw hole 69a extending outside of the radial direction. The slit 69b is formed in the projection direction of the attachment brackets 65 and 66 and reaches before the edge 69c by the tip side of the seat 69. Namely, the entrance side of the slit 69b continuing to the screw hole 69a is formed to open but the tip of the slit 69b is a closed end so as to be opened carelessly.

In addition, this invention is not limited to forming the slit 69b in the direction in which the attachment brackets 65 and 66 project. If the slit 69b is formed in the position and direction of this embodiment, the tension acts on the root of the attachment brackets 65 and 66 and there is an effect of the slit 69b being easily to open. When the slit 69b is formed in the direction intersecting perpendicularly in the direction in which the attachment brackets 65 and 66 project, although a large force cannot be applied to the attachment brackets 65 and 66 of being weak in shearing and a possibility of damaging, if the root of the attachment brackets 65 and 66 is reinforced, it is possible to remove the attachment brackets 65 and 66 from the securing bolt 70.

Since the width size of the slit 69b is formed in the size narrower than the outer diameter of the axial part 70b of the securing bolt 70, in the fixed state (FIG. 3A) of the attachment brackets 65 and 66, the securing bolt 70 does not advance into the slit 69b and the attachment brackets 65 and 66 does not separate carelessly from the securing bolt 70.

Figure 3A:
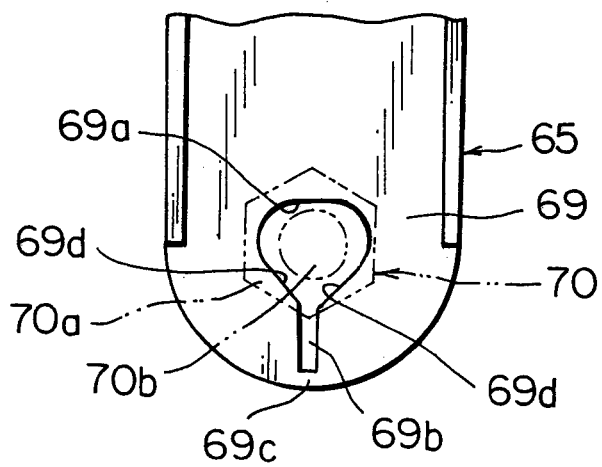
FIGS. 3A-3C are the process over time of the attachment bracket shown in FIG. 2 being separated from a securing bolt, where
Figure 3B:
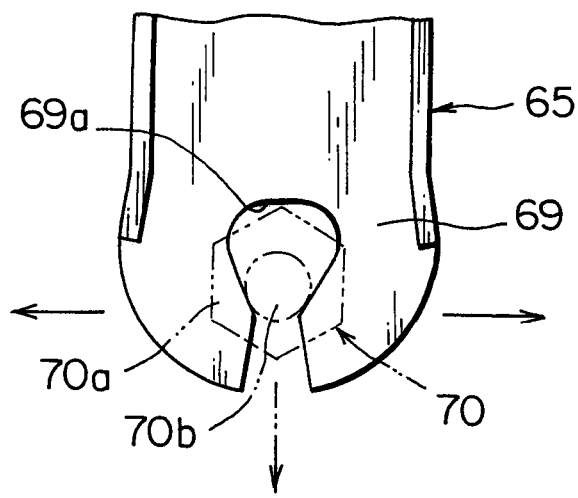
Figure 3C:
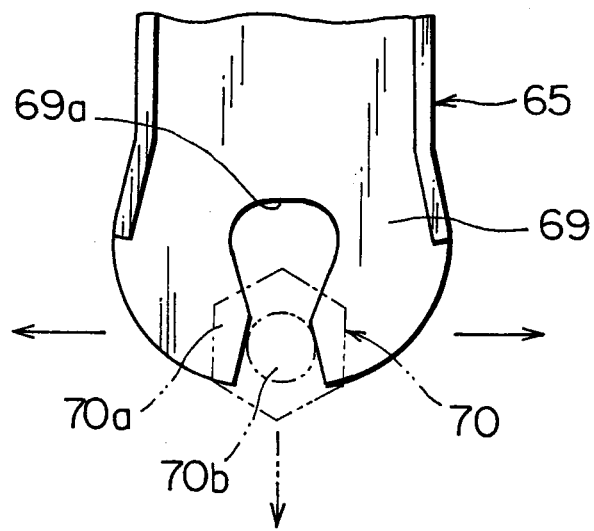

As shown in FIGS. 3A-3C, a taper portion 69d is formed in the entrance side of the slit 69b, abutting to the axial part 70b of the securing bolt 70, to guide and advance the securing bolt 70 into the slit 69b. For this reason, when the case main body 61 is pulled or twisted at the time of recovery of the case main body 61, the axial part 70b of the securing bolt 70 abuts the taper portion 69d and extends the tapered part 69d and advances into the slit 69b smoothly (FIG. 3B). Simultaneously, the tip side of the slit 69b fractures and separates, the both sides of slit 69b becomes free, it bends outward making possible the axial part 70b of the securing bolt 70 pass, and the attachment brackets 65 and 66 separate from the securing bolt 70 (FIG. 3C).

As mentioned above, according to the 1st embodiment, the case main body 61 can be prevented from carelessly separating from the cowl side panel by vibration or shock under vehicles run. If the case main body 61 is pulled or twisted in the direction separating from the cowl side panel, the axial part 70b of the securing bolt 70 extends the slit 69b, escaping from one side of the slit 69b on another side, and the attachment brackets 65 and 66 separate from the securing bolt 70 and the case main body 61 is easily recovered from the cowl side panel. The axial portion 70b of the securing bolt 70 abuts the taper part 69d and is guided by it, the slit 69b can be opened easily and improves the recovery workability further.

Figure 5:
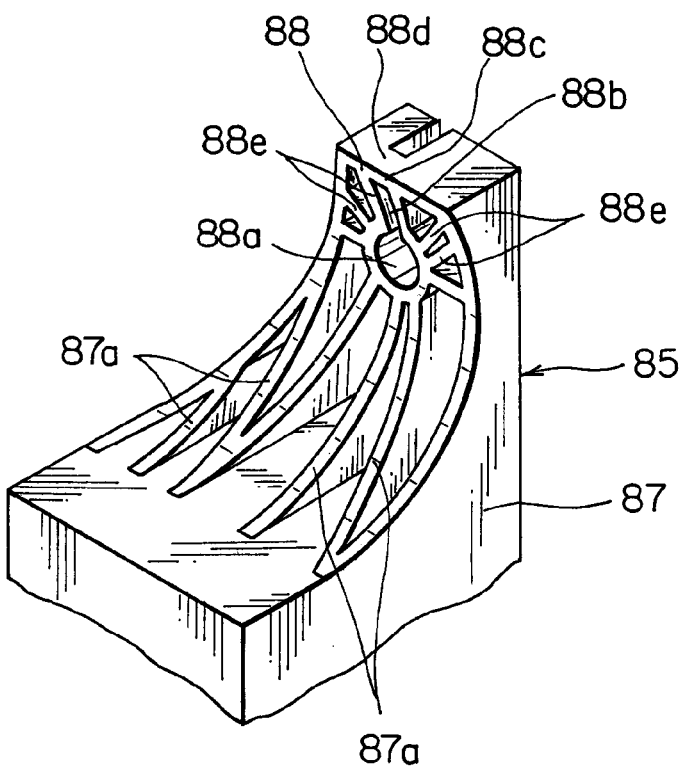
FIG. 5 is a enlarged view of the attachment bracket shown in FIG. 4.
Figure 4:
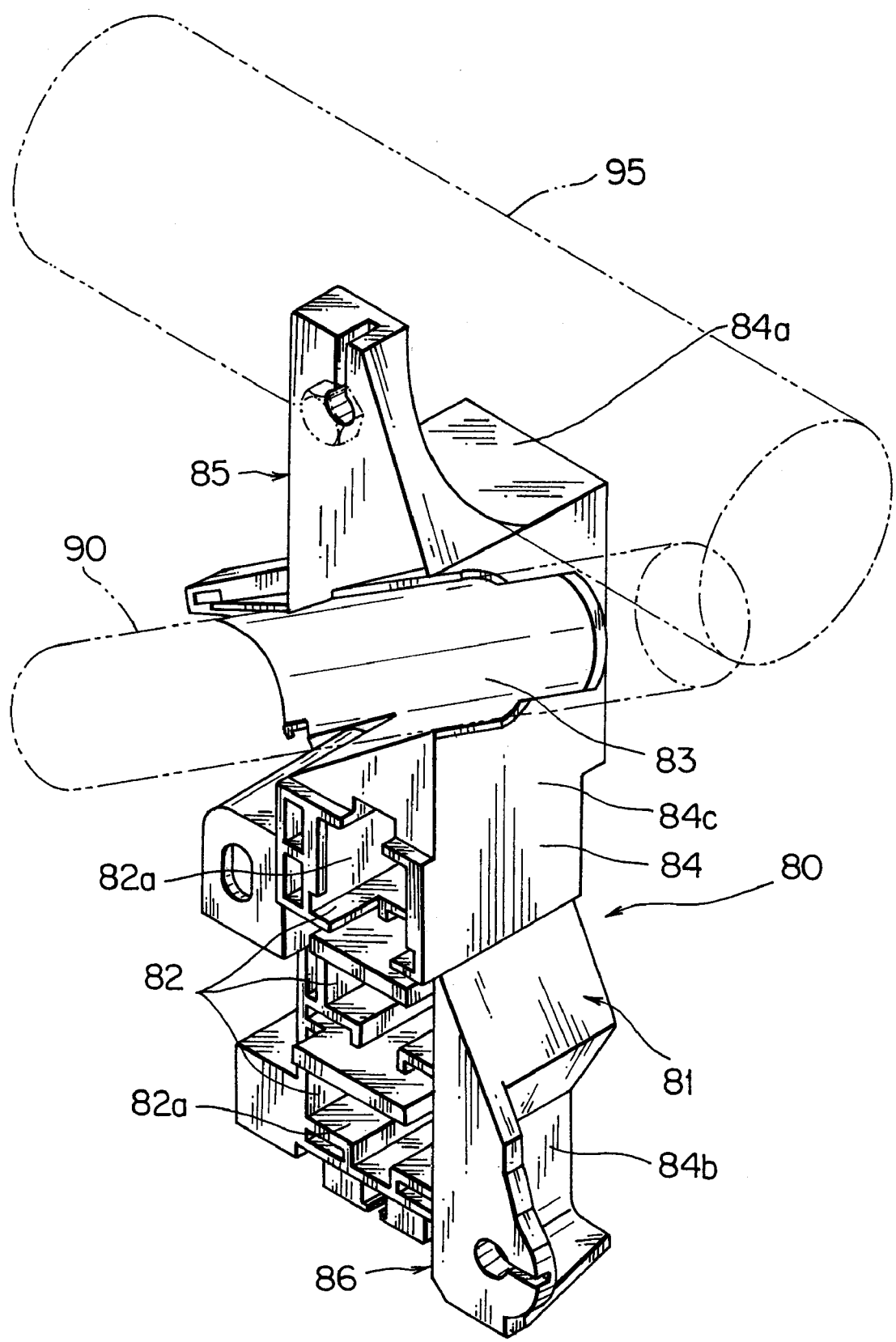
FIG. 4 is a perspective view showing the 2nd embodiment of the electric connection box provided with the detachable attachment structure according to the present invention.
Figure 6:
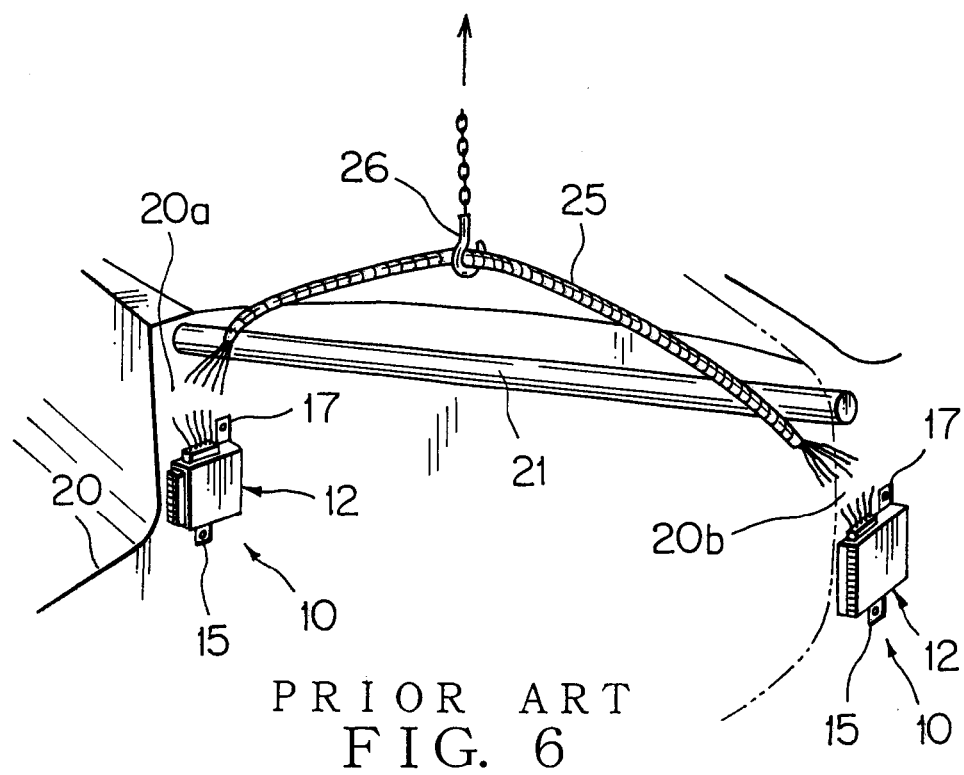
FIG. 6 is a conventional example of the electric connection box provided with attachment structure and a perspective view of wiring harness being disconnected by pulling a J-hook to the upper direction.
Figure 7:
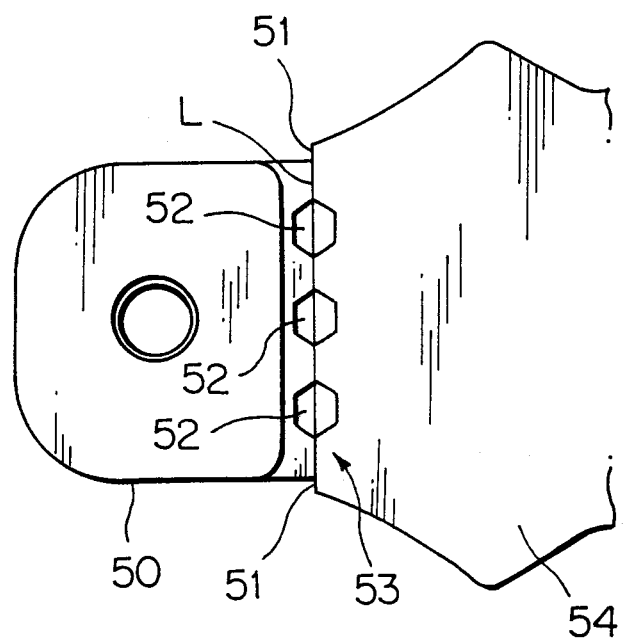
FIG. 7 is a plan view showing other conventional examples of the electric connection box provided with attachment structure.

Next, it is explained about the main constitution portion and its action with regard to the connector block 80 of the 2nd embodiment of the present invention shown in FIGS. 4 and 5. The connector block 80 of the present embodiment is attached in the reinforcement 95 of the circumference of an instrument panel and is different from the junction box 60 of the 1st embodiment attached in a cowl side panel. Moreover, it is different from the 1st embodiment in that a thin portion 88d which carries out fracture separation preferentially at the time of block main body 81 recovery, is formed in the tip side of a slit 88b in the attachment brackets 85 and 86.

The connector block 80 is mold forming of synthetic resin material, such as polypropylene, and the connector block 80 comprises a block main body 81 which has a plurality of connector receiving section 82 and harness wearing section 83, and a connector (not shown) which is connected to the branch line of a wiring harness 90. Since a plurality of connectors are fixed by the connector receiving portion 82 by the locking means, even if the wiring harness 90 is pulled at the time of recovery of the block main body 81, the connector does not slip out of the connector receiving portion 82.

The block main body 81 comprises a connector receiving portion 82 corresponding to the form size of a connector, a harness wearing portion 83 winding and retaining the wiring harness 90 pulled out from electric equipment, such as meters, and a pair of attachment brackets 85 and 86 provided saliently to a circumferential wall 84. The connector receiving portion 82 is surrounded by a wall at four quarters and the front and the rear wall has an opening. A engaging portion (not shown) engaging to the locking portion of the connector is disposed in the inner surface 82a. One female connector fits in from the rear opening, being locked inside of the connector receiving portion 82, the male connector of another side is fitted in the female connector from the front side.

The harness wearing portion 83 has a shape of a semicircle pipe and is formed with the block main body 81 ranging over the wall 84c and 84c of right and left thereof. Wiring harness 90 is fixed to the harness wearing portion 83 by winding a tape towards intersecting the reinforcement 95. In addition, the harness wearing portion 83 is also possible to be formed with the block main body 81 as a pipe-like harness protector.

A pair of attachment brackets 85 and 86 are formed in an upper wall 84a and a lower wall 84b of the block main body 81 to the direction intersecting perpendicularly mutually, respectively. The block main body 81 is positioned in the direction of 2 axes by making the pair of attachment brackets 85 and 86 intersect perpendicularly. The upper attachment bracket 85 is attached in the cylindrical face of the reinforcement 95 and the lower attachment bracket 86 is attached in the body panel around the instrument. The lower attachment bracket 86 is the same constitution as the attachment bracket 65 and 66 in the 1st embodiment and the explanation is omitted.

As shown in FIG. 5, the upper attachment bracket 85 comprises the base 87 of the root side continuing to the wall 84 and a seat 88 following the base 87. The base 87 is reinforced with the reinforcement rib 87a for preventing falls. The seat 88 is a portion to be secured and fixed between the reinforcement 95 and the head of a securing bolt. A screw hole 88a is formed through for inserting the securing bolt through to the axial direction at the center of the seat 88. A radial rib 88e is disposed for enforcement in the circumference of the screw hole 88a.

A slit 88b extended to the outside of the radius direction is formed in communication with the screw hole 88a. The slit 88b is formed in the direction in which the attachment bracket 85 projects and reaches before an edge 88c of the tip side of the seat 88 and the tip of the slit 88b is a closed end. For this reason, as the 1st embodiment, the slit 88b is not opened carelessly and the attachment bracket 85 does not separate from the securing bolt.

The slit 88b is incised in the tip side of the slit 88b leaving a thin portion 88d. The thin portion 88d is the portion having a priority for fracture over other portions at the time of recovery of the block main body 81. For this reason, the thin portion 88d is fractured and separated, resulting in that the slit 88b can be easily opened, the tensile force to pull the wiring harness 90 can be weakened and the recovery workability of the block main body 81 improves. The thickness of the thin portion 88d is formed in the size which does not separate by fracture during use of the vehicle but separate by fracture only at the time of recovery of the block main body 81.

As mentioned above, according to the 2nd embodiment, when the block main body 81 is pulled or twisted, the axial part of the securing bolt enters into the slit 88b, the thin portion 88d is pulled by the tensile stress of the direction of the circumference in the circumferential direction, the thin portion 88d is fractured and separated preferentially by a small force. The portions other than the thin portion 88d are not damaged so as to recover the block main body 81 as it is and become possible to present reuse.

Although the present invention has been fully described by way of examples with reference to the accompanying drawings, it is to be noted that various change and modifications can be made with the scope of the present invention.

The invention claimed is:

1. Detachable attachment structure for attaching a part main body to a vehicle body side by a securing member for collecting, characterized in that the part main body is provided with a vehicle body attachment portion having a screw hole, the vehicle body attachment portion is provided with a slit communicating into the screw hole and extending outwardly to the radial direction, when the part main body is pulled or twisted in the direction separating from the vehicle body side at the time of recovery of the part main body, the securing member extends and passes the slit, and the vehicle body attachment portion is detached from the securing member.

2. The detachable attachment structure described in claim 1, characterized in that the slit reaches before the edge of the vehicle body attachment structure.

3. The detachable attachment structure described in claim 2, characterized in that a thin portion is formed at the end of the slit, preferentially broken for separation at the time of recovery of the part main body.

4. The detachable attachment structure described in claim 1, characterized in that the slit is formed in the projection direction of the vehicle body attachment portion.

5. The detachable attachment structure described in claim 1, characterized in that a taper portion is formed at the entrance side of the slit for guiding the entering of the securing member.

6. The detachable attachment structure described in claim 1, characterized in that the vehicle body attachment portion is made of an elastic synthetic resin material.

7. An electric connection box having the detachable attachment structure described in claim 1, characterized in that electric parts connected with wiring harness are received in the part main body, when the wiring harness is pulled or twisted in the direction separating from the vehicle body side at the time of recovery of the part main body, the part main body is recovered from the vehicle body.

* * * * *